(12) United States Patent
Gradinger et al.

(10) Patent No.: US 12,108,580 B2
(45) Date of Patent: Oct. 1, 2024

(54) DIRECT COOLING OF A POWER CONVERTER BY USING A STAMPED PLATE

(71) Applicants: AUDI AG, Ingolstadt (DE); Hitachi Energy Ltd, Zurich (CH)

(72) Inventors: Thomas Gradinger, Aarau Rohr (CH); Andreas Apelsmeier, Pollenfeld (DE); Benjamin Söhnle, Ingolstadt (DE); Daniele Torresin, Baden (CH)

(73) Assignees: AUDI AG, Ingolstadt (DE); Hitachi Energy Ltd, Zurich (CH)

( * ) Notice: Subject to any disclaimer, the term of this patent is extended or adjusted under 35 U.S.C. 154(b) by 81 days.

(21) Appl. No.: 17/435,489

(22) PCT Filed: Feb. 27, 2020

(86) PCT No.: PCT/EP2020/055139
§ 371 (c)(1),
(2) Date: Sep. 1, 2021

(87) PCT Pub. No.: WO2020/178131
PCT Pub. Date: Sep. 10, 2020

(65) Prior Publication Data
US 2022/0142016 A1 May 5, 2022

(30) Foreign Application Priority Data
Mar. 4, 2019 (DE) .................. 10 2019 202 902.7

(51) Int. Cl.
*H05K 7/20* (2006.01)
*H01L 23/473* (2006.01)
(52) U.S. Cl.
CPC ....... *H05K 7/20927* (2013.01); *H01L 23/473* (2013.01)

(58) Field of Classification Search
CPC ....... H01L 2924/14; H01L 2224/73265; H01L 2924/0002; H01L 23/473; H01L 23/467;
(Continued)

(56) References Cited

U.S. PATENT DOCUMENTS 5,526,867 A * 6/1996 Keck ..................... C22C 1/1015
174/547
2011/0079376 A1 * 4/2011 Loong ..................... B01D 8/00
165/185
(Continued)

FOREIGN PATENT DOCUMENTS

CN 101924043 A 12/2010
CN 102055305 A 5/2011
(Continued)

OTHER PUBLICATIONS

Shin, 'Inverter Structure of Water Cooling Type for Electric Vehicle', Oct. 12, 2017, Espacenet, Description (Translation of KR 20170112812 A) (Year: 2017).*

(Continued)

*Primary Examiner* — Stephen S Sul
*Assistant Examiner* — Jeffrey Francis Stoll
(74) *Attorney, Agent, or Firm* — Maier & Maier, PLLC

(57) ABSTRACT

A power converter including a semiconductor module having a base plate and a cooling housing. The cooling housing includes a receptacle plate and a cover. The receptacle plate has an opening. The receptacle plate is connected to the base plate of the semiconductor module around the opening. The cover is connected to the receptacle plate along a closure path around the opening, and either the receptacle plate or the cover is formed as a stamped or deep-drawn plate.

14 Claims, 4 Drawing Sheets

(58) Field of Classification Search
CPC ....... H01L 23/46; H01L 24/03; H01L 23/427; H01L 2924/351; H01L 21/67098; H05K 7/20927; H05K 7/20936; H05K 7/20254
See application file for complete search history.

(56) References Cited

U.S. PATENT DOCUMENTS

| | | | | |
|---|---|---|---|---|
| 2013/0146254 | A1* | 6/2013 | Jeon | H01L 23/473 165/104.11 |
| 2015/0061112 | A1* | 3/2015 | Bogen | H01L 23/3672 257/714 |
| 2016/0143193 | A1 | 5/2016 | Ono et al. | |
| 2017/0055378 | A1* | 2/2017 | Zhou | H05K 7/20927 |
| 2017/0287809 | A1 | 10/2017 | Schultz | |
| 2019/0279917 | A1* | 9/2019 | Gohara | F28F 3/025 |

FOREIGN PATENT DOCUMENTS

| | | | | |
|---|---|---|---|---|
| CN | 104067502 | A * | 9/2014 | ......... H01L 23/4006 |
| CN | 106531708 | A | 3/2017 | |
| CN | 104701278 | B * | 12/2017 | ........... H01L 23/473 |
| DE | 102013109589 | B3 | 3/2015 | |
| DE | 112016001221 | T5 | 12/2017 | |
| EP | 0831684 | A2 | 3/1998 | |
| EP | 2605392 | A2 | 6/2013 | |
| EP | 3276657 | A1 | 1/2018 | |
| JP | 2009046528 | A | 3/2009 | |
| JP | 2013062506 | A | 4/2013 | |
| JP | 2013210177 | A | 10/2013 | |
| KR | 20170112812 | A * | 10/2017 | |
| NL | 7907254 | A * | 4/1980 | ............ H01L 24/45 |

OTHER PUBLICATIONS

"Plate" Merriam-Webster.com Dictionary, Merriam-Webster, Noun, 1a, URL: https://www.merriam-webster.com/dictionary/plate. Accessed Aug. 23, 2023 (Year: 2023).*
German Examination Report issued on Feb. 1, 2021 in corresponding German Application No. 10 2019 202 902.7: 20 pages; Machine translation attached.
International Search Report (with English translation) and Written Opinion (with Machine translation) issued on May 15. 2020 in corresponding International Application No. PCT/EP2020/055139; 19 pages.
International Preliminary Report on Patentability issued on Jan. 25, 2021 in corresponding International Application No. PCT/EP2020/055139; 22 pages.
Office Action issued on Jan. 16, 2024, in corresponding Japanese Application No. 2021-552619, 6 pages.
Office Action issued on Apr. 23, 2024, in corresponding Chinese Application No. 202080018873.9, 14 pages.

* cited by examiner

DIRECT COOLING OF A POWER CONVERTER BY USING A STAMPED PLATE

FIELD

The subject matter of the present invention is a power converter comprising at least one semiconductor module having a base plate and a cooling housing.

BACKGROUND

The strong increase of electric vehicles generates a high pressure on the performance and the costs of power semiconductor modules which are used in electrical drivetrains. For semiconductor modules, this means in particular a continuous development toward higher operating temperatures and higher power densities.

One possible way of expanding permissible operating temperatures to a higher level can be to replace the conventional potting of semiconductor module upper sides with injection molding. An injection molded module can have a base plate, which is held in a molding compound. For optimum cooling, cooling structures can be formed integrated directly into the base plate, wherein the cooling structures are in contact with a cooling fluid.

A semiconductor module or half-bridge module generally comprises two functional changers. To provide a three-phase converter, three semiconductor modules have to be combined. Accordingly, a cooler has to have an inlet opening and an outlet opening, wherein a cooling fluid which is guided through the cooler has to flow through the cooling structures of all three semiconductor modules.

It is conceivable to arrange all six functional changers of the power converter on a single large plate. However, there is generally a limit in molding presses with respect to the maximum possible volume of the molding compound. This volume is exceeded in the case of a combination of three semiconductor modules. If moreover all semiconductor chips are installed on a single base plate before they are tested, this results in a significant reduction of the production yield due to faulty chips or connections. To achieve a good output, it is therefore important to produce and test half-bridge modules individually before they are combined to form a power converter.

A package of power electronics is known from document EP 0 831 684 A2. The package has a deep-drawn, hat-shaped cover and a flat sealed base, which are connected to one another in order to close the electronic circuit board by folding over a circumferential edge hanging down of the cover around the circumferential edge. The cover can have an L-shaped circumferential edge, wherein a first section protrudes radially outward and a second section hangs downward.

SUMMARY

It is the object of the present invention to provide a power converter which enables a reliable, compact, and economic arrangement of various closely combined half-bridge modules, in particular a six-pack configuration.

The subject is achieved by a power converter having the features of claim 1 and by a method having the features of claim 9. Advantageous refinements and embodiments are the subject matter of the description and the description of the figures.

The subject matter of the present invention is a power converter comprising at least one semiconductor module having a base plate and a cooling housing.

According to the invention, the cooling housing comprises a receptacle plate and a cover, wherein the receptacle plate has at least one opening, wherein the receptacle plate is connected to the base plate of the semiconductor module around the at least one opening, wherein the cover is connected to the receptacle plate along a connecting region around the at least one opening, wherein either the receptacle plate or the cover is formed as a stamped or deep-drawn plate.

The semiconductor module generally comprises a substrate and a base plate, wherein the base plate is arranged by means of a molding compound on the substrate. A cooling structure is typically arranged on the base plate. In general, the base plate is formed from an aluminum-coated copper, from aluminum, from an aluminum alloy, or from AlSiC (aluminum silicon carbide).

The receptacle plate is formed as a frame and generally has at least one opening which is configured to accommodate at least a part of the base plate. In general, the opening is configured to accommodate the cooling structure of the base plate. The opening is generally formed rectangular. Optionally, the opening can have rounded corners. The base plate has a connecting region which is formed in each case around an opening of the base plate. The base plate is welded in the connecting region to the receptacle plate. This offers the advantage that semiconductor modules are arranged so they are also testable after the welding. Due to the welding of the semiconductor modules, in particular the base plate to the receptacle plate, the cooling structure of the semiconductor modules/half-bridge modules cannot be expanded up to the boundary of the cooling duct, since the overlap region of the receptacle plate and the base plate of the semiconductor module has to be accessible to the welding device. Therefore, a surrounding flow blocker can optionally be used in the cooling housing.

The cover is configured to form the cooling housing or a cooling duct together with the receptacle plate. The cover is generally welded onto the receptacle plate here. A sealed cooling duct or a sealed cooling housing, which is configured to guide a cooling fluid, is formed by the welding on of the cover. The cover can be formed bent, wherein the bend can be formed bent toward the base plate, bent away from the base plate, or in parallel to the base plate. A design of the cover bent toward the base plate offers the advantage that instead of a T-weld, in which two plates arranged at a right angle to one another are welded to one another, a flange weld can be carried out since the rounded corners of the cover do not meet the base plate at a right angle. A flange weld offers the advantage that the sensitivity of mechanical tolerances of the welding procedure can be reduced and the robustness and leak-tightness of the closed cooling housing can be increased, since flange welds withstand higher pressures. A further advantage is that the receptacle plate and the cover can be produced by deep drawing or by stamping. Stamping is a special form of deep drawing with depth which is not excessively large.

The stamped embodiment of the receptacle plate moreover offers the advantage that the production costs are reducible to a minimum and at the same time good welding capability and leak-tightness can be ensured, in particular in comparison to parts made of diecast aluminum. The present invention is thus particularly advantageous for the integration of directly water-cooled, compression-molded semiconductor modules in a traction inverter for electric vehicles.

In one embodiment, the base plate, the receptacle plate, and the cover are configured to form the cooling housing or a cooling duct for a cooling fluid. In general, the base plate, the receptacle plate, and the cover are connected to one another in such a way that a spacing is formed between them, which is configured to accommodate the cooling structures of the base plate. The cooling duct and the cooling housing are configured so that a cooling fluid can flow through them. A cooling fluid can be water, a water-glycol mixture, or another coolant.

The cover is configured to be connectable to the receptacle plate. The cover is connected to the receptacle plate and forms a cooling housing or a cooling duct together with the receptacle plate. The required height (volume) of the cooling housing or the cooling duct, in particular the height which is necessary to house a cooling structure in the cooling housing or the cooling duct, is achieved by stamping or deep drawing of either the receptacle plate and/or the cover or both.

The cover therefore optionally has a stamping or a deep drawing. For example, a stamping can be formed bent or trough-shaped. The receptacle plate thus optionally has a stamping or a deep drawing. For example, a stamping can be formed bent or trough-shaped.

In one refinement, the base plate has a cooling structure, which is subjected to the cooling fluid in the opening of the receptacle plate. A cooling structure can be designed, for example, in the form of cooling ribs or cooling pins. In general, the cooling structure is formed adjacent to a semiconductor chip on the base plate.

In a further refinement, either the receptacle plate or the cover is formed trough-shaped, wherein the depth of the trough-shaped form provides the required height of the cooling duct and the required height to accommodate a cooling structure, in particular cooling ribs.

In one embodiment, the cover has an inlet opening and an outlet opening to connect the semiconductor module in a fluid-conducting manner A cooling fluid can be introduced into the cooling housing through the inlet opening. In general, the cooling fluid flows from the inlet opening to the outlet opening. In this case, the cooling fluid flows through at least one of the cooling structures of the semiconductor modules arranged in the plate. The inlet opening and the outlet opening can each be formed as separate components which are attachable in a separate step to the cover. For example, the inlet opening and the outlet opening can be welded onto the cover. Alternatively, the inlet opening and the outlet opening are formed as depressions of the cover. The inlet opening and the outlet opening are typically configured to be connectable to plugs having O-rings or seals.

In one embodiment, the receptacle plate is connected to the base plate by welding, in particular by laser welding, and/or the cover is connected to the receptacle plate by welding, in particular CMT (cold metal transfer) welding. Alternatively, the receptacle plate is connected to the base plate by means of laser metal deposition (LMD) welding. In general, the receptacle plate is connected to the base plate in the connecting region which is formed circumferentially around an opening of the receptacle plate.

In one refinement, the receptacle plate and the base plate are formed from aluminum or an aluminum alloy. Alternatively, the receptacle plate is formed from a copper coated with aluminum.

In one embodiment, the receptacle plate has an embossing, wherein the receptacle plate is configured and formed to accommodate a surrounding flow blocker in the embossing, wherein the surrounding flow blocker is configured to conduct a cooling fluid via the cooling structure.

The receptacle plate can optionally comprise the surrounding flow blocker. The surrounding flow blocker can be applied to the receptacle plate before the cover is welded to the receptacle plate to form the cooling duct. The surrounding flow blocker is thus formed and configured as an insert.

The surrounding flow blocker is configured to guide the cooling fluid. The surrounding flow blocker is configured to guide the cooling fluid in such a way that it flows through the cooling structures of the semiconductor modules. The surrounding flow blocker thus prevents the cooling fluid from bypassing the cooling structures of the semiconductor modules or reduces such bypassing. This contributes to improved cooling performance. Moreover, the surrounding flow blocker can be formed as a deposit surface, on which the cover can be rested after the cover has been applied to the receptacle plate. This ensures the vertical alignment of the cover during the welding of the cover with the receptacle plate. Alternatively, the cover can rest solely on the cooling structure of the base plate during the procedure of the welding. The surrounding flow blocker can be formed from a plastic or a metal. The material of the surrounding flow blocker is selectable in dependence on a temperature increase of an adjoining process. In a further alternative embodiment, the surrounding flow blocker is formed integrated in the cover.

Furthermore, the present invention relates to a method for producing a power converter comprising a semiconductor module having a base plate and a cooling housing, wherein the cooling housing comprises a receptacle plate and a cover, according to one of the preceding features.

In a first step, the receptacle plate is welded on the base plate. For this purpose, both the receptacle plate and also the base plate have a weldable material in a connecting region. During the connection of the receptacle plate to the base plate, the base plate is connected to the receptacle plate in such a way that the cooling structure is guided or can be guided through an opening of the base plate and thus is subjected or can be subjected directly to the coolant.

In a further step generally chronologically following the first step, the cover is welded on the receptacle plate. The cooling housing or the cooling duct is formed by this step. A sealed housing is formed by the welding, which can guide a cooling fluid.

The above-described method furthermore offers the advantage that material is only required for the receptacle plate, in particular aluminum. Moreover, only the methods stamping, cutting, and welding are required for the production. The material for the receptacle plate, the cover, and the inlet and outlet openings is generally aluminum. The openings of the receptacle plate are generally cut out or stamped out.

To connect the receptacle plate to the base plate of the half-bridge modules and to connect the receptacle plate to the cover, in general a welding method is used. This procedure can be automated for a high production volume.

In an alternative embodiment, the cooling housing or the cooling duct is formed from an extruded material, wherein the cooling housing or the cooling duct is formed from at least two parts.

In a further alternative embodiment, the cooling housing or the cooling duct is made of diecast aluminum.

In one refinement of the method, a surrounding flow blocker is inserted into the receptacle plate before the welding of the cover on the receptacle plate. The surrounding flow blocker is designed as a frame circumferential around the semiconductor modules.

BRIEF DESCRIPTION OF THE FIGURES

The invention is schematically shown on the basis of embodiments in the drawing and is described further with reference to the drawing, wherein identical components are identified by identical reference numerals. In the figures.

DETAILED DESCRIPTION

Figure 1:
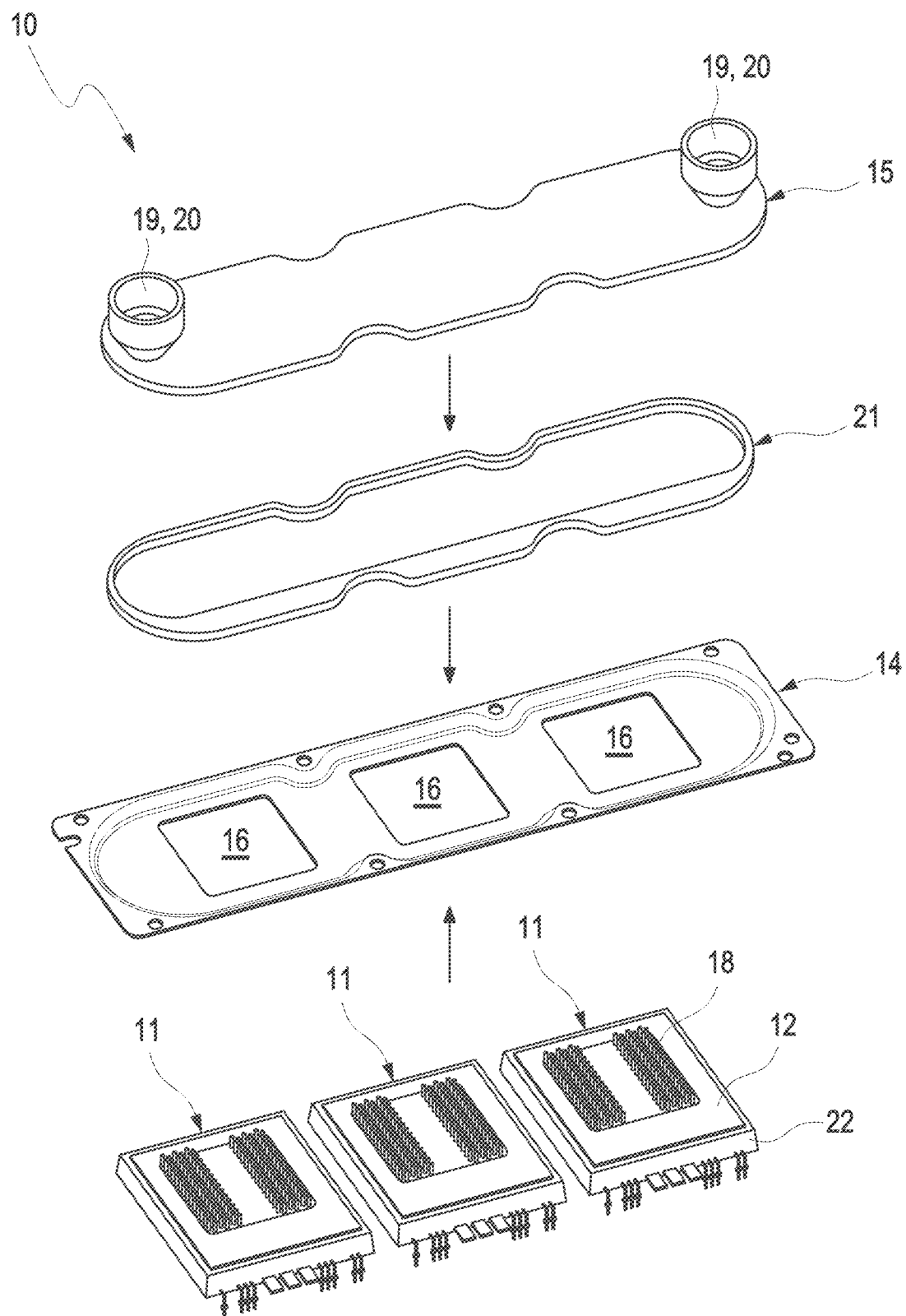
FIG. 1 shows a perspective exploded view of a structure of a power converter according to the invention.

FIG. 1 shows a perspective exploded view of a structure of a power converter 10 according to the invention. Three semiconductor modules 11 are shown, which each have a substrate 22 and a base plate 12. Cooling ribs 18 are formed on the base plate 12. The three semiconductor modules 11 are introduced into a shared receptacle plate 14, wherein the receptacle plate 14 has openings 16 corresponding to the number of the semiconductor modules 11. An opening 16 is configured in each case to accommodate a semiconductor module 11 in such a way that the cooling ribs 18 are arranged in the opening 16.

The three semiconductor modules 11 are each welded to the receptacle plate 14 in a connecting region, which is formed in each case around an opening 16. The receptacle plate 14 is configured to accommodate a surrounding flow blocker 21. The surrounding flow blocker 21 can optionally be arranged in the receptacle plate 14.

The surrounding flow blocker 21 is designed as a frame enclosing the semiconductor modules. The receptacle plate 14 has a depression, in which the surrounding flow blocker 21 can be introduced. The receptacle plate 14 having the surrounding flow blocker 21 can be closed by means of a cover 15, whereby a cooling housing or cooling duct is formed. The cover 15 has each of an inlet opening and an outlet opening 19, 20, via which a cooling fluid can be introduced into the cooling housing or the cooling duct.

Figure 2A:
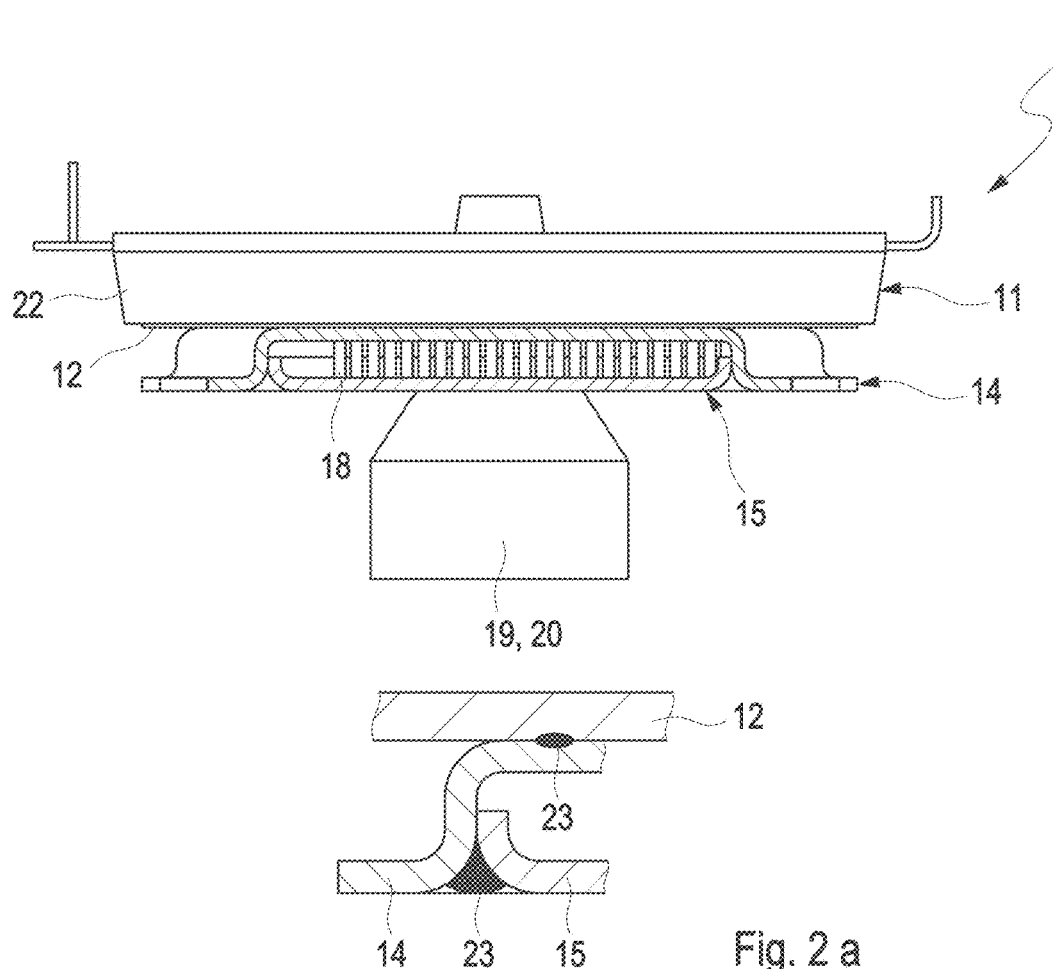
FIG. 2 shows a side view of a structure of a power converter having three embodiments of the arrangement of a base plate, a receptacle plate, and a cover.

FIG. 2 shows a side view of a structure of a power converter 10—shown in FIG. 1—having three embodiments of the arrangement of a base plate 12, a receptacle plate 14, and a cover 15. In the first embodiment in FIG. 2a, the base plate 12 is shown as well as the receptacle plate 14 and the cover 15. In this case, both the receptacle plate 14 and also the cover 15 each have a curved, bent shape here. The receptacle plate 14 is connected via a connecting region 23, which is formed as a spot weld, to the base plate 12. The bent cover 15 is connected via a further connecting region 23, which is formed as a spot weld, to the receptacle plate 14.

Figure 2B:
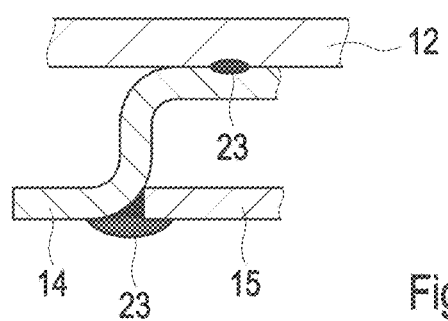

In the second embodiment in FIG. 2b, the base plate 12 is shown as well as the receptacle plate 14 and the cover 15. In this case, the receptacle plate 14 has a bent, curved shape, while the cover 15 is formed level or straight. The receptacle plate 14 is connected via a connecting region 23, which is formed as a spot weld, to the base plate 12. The linear cover 15 is connected via a further connecting region 23, which is formed as a spot weld, to the receptacle plate 14.

Figure 2C:
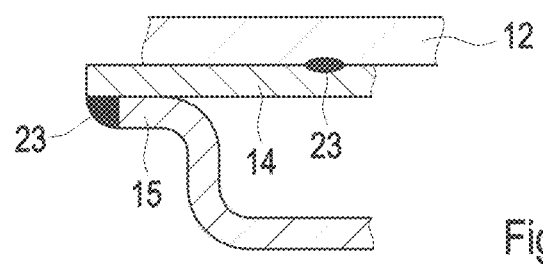

In the third embodiment in FIG. 2c, the base plate 12 is shown as well as the receptacle plate 14 and the cover 15. In this case, the receptacle plate 14 has a straight or linear design, while the cover 15 has a bent, curved shape. The straight receptacle plate 14 is connected via a connecting region 23, which is formed as a spot weld, to the base plate 12. The bent cover 15 is connected via a further connecting region 23, which is formed as a spot weld, to the receptacle plate 14.

Figure 3:
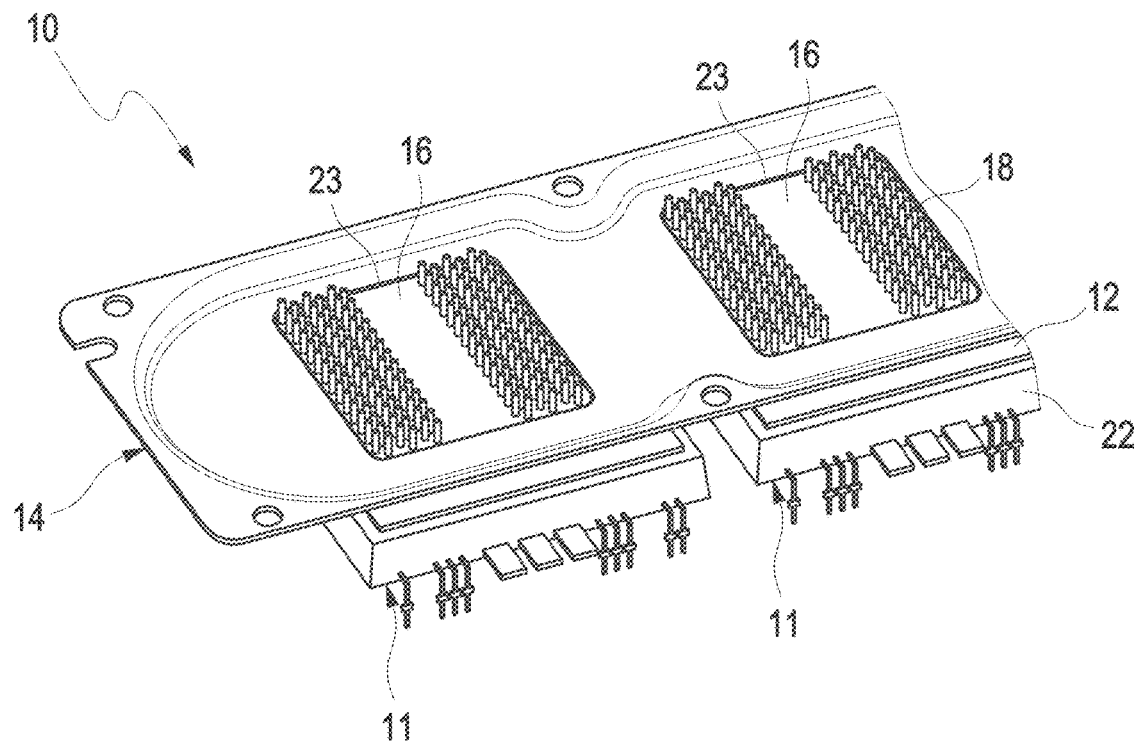
FIG. 3 shows a perspective view of two semiconductor modules welded to a receptacle plate.

FIG. 3 shows a perspective view of two semiconductor modules 11 welded to a receptacle plate 14. The semiconductor modules 11 each have a substrate 22 and a base plate 12. Cooling structures in the form of cooling ribs 18 are formed in each case on the base plate 12. The two semiconductor modules are each arranged in an opening 16 of a receptacle plate 14. The two semiconductor modules 11 are each connected, in particular welded, via connecting regions 23, which are each formed around a respective opening 16, to the receptacle plate 14. The cooling ribs 18 point through the openings 16 of the receptacle plate 14.

Figure 4:
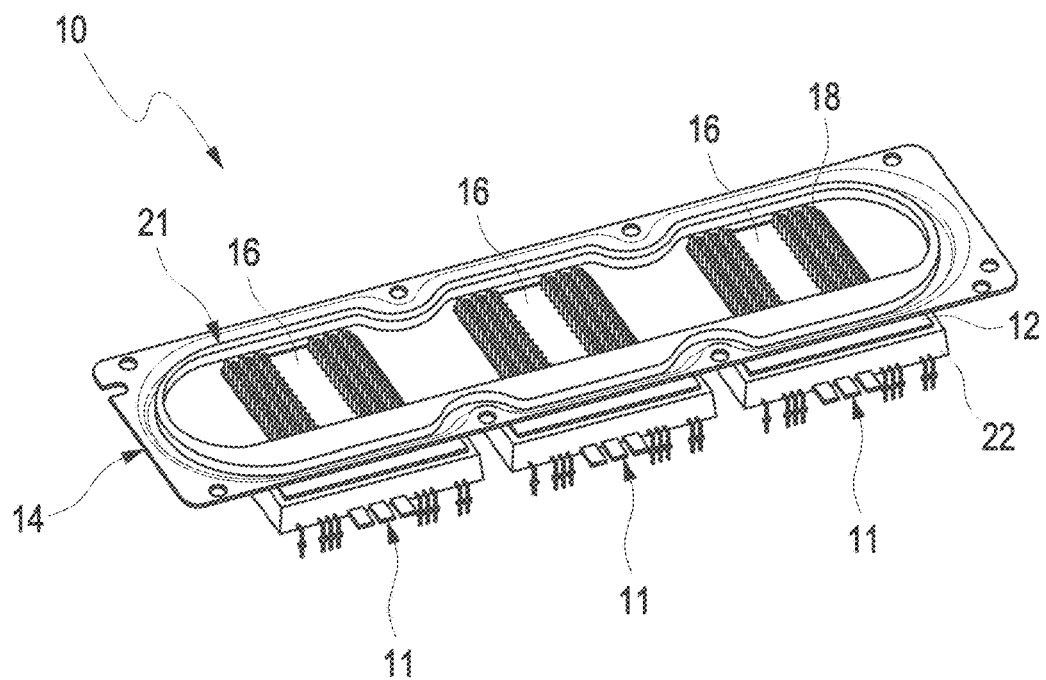
FIG. 4 shows a perspective view of three semiconductor modules welded to a receptacle plate having a surrounding flow blocker arranged in the receptacle plate.

FIG. 4 shows a perspective view of three semiconductor modules 11 welded to a receptacle plate 14 with a surrounding flow blocker 21 arranged in the receptacle plate 14. The three semiconductor modules 11 are each connected, in particular welded, to the receptacle plate 14. The cooling ribs 18 point through the openings 16 of the receptacle plate 14. The receptacle plate 14 has a depression which is configured to accommodate the surrounding flow blocker 21. The surrounding flow blocker 21 is designed as a frame enclosing the three semiconductor modules 11.

Figure 5:
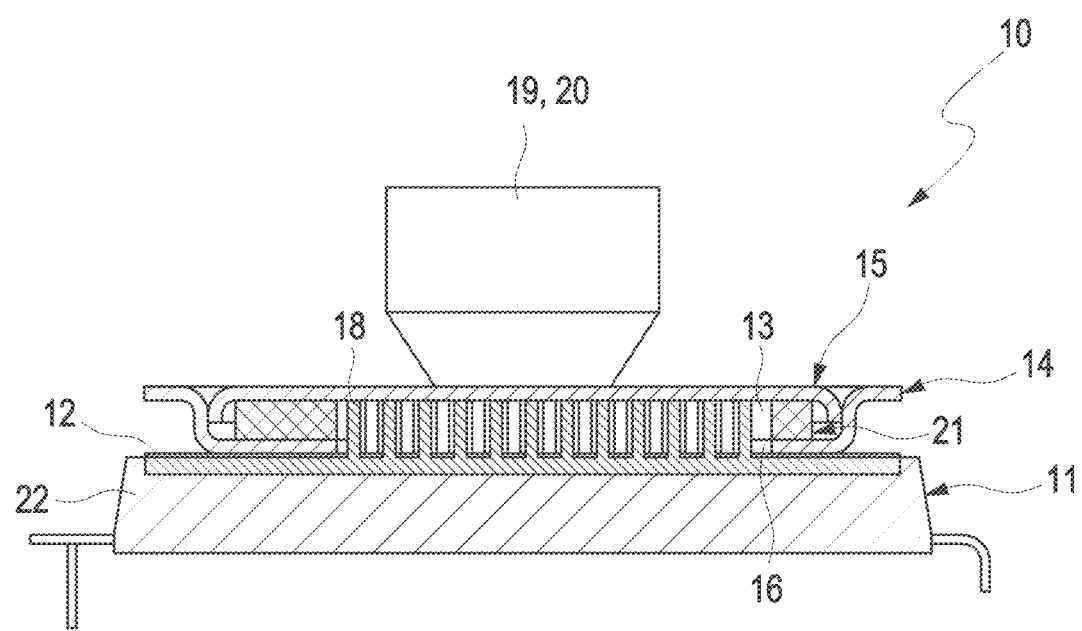
FIG. 5 shows a side view of a structure of a power converter according to the invention having a base plate, a receptacle plate, a surrounding flow blocker, and a cover.

FIG. 5 shows a side view of a structure of a power converter 10 according to the invention having a base plate 12, a receptacle plate 14, a surrounding flow blocker 21, and a cover 15. Both the cover 15 and also the receptacle plate 14 each have a stamping, which is formed in each case as a curved, bent shape. The stamping of the receptacle plate 14 is formed opposite to the stamping of the cover 15, whereby a cooling housing 13 or a cooling duct is formed, which can accommodate the cooling structure 18 of the semiconductor module 11.

The receptacle plate 14 is connected via a connecting region, which is formed as a spot weld, to the base plate 12. The bent cover 15 is connected via a connecting region, which is formed as a spot weld, to the receptacle plate 14. Furthermore, the surrounding flow blocker 21 is shown in the receptacle plate 14.

LIST OF REFERENCE NUMERALS 10 power converter
11 semiconductor module
12 base plate
13 cooling housing
14 receptacle plate
15 cover
16 opening
17 cooling duct
18 cooling structure, cooling ribs
19 inlet opening
20 outlet opening
21 surrounding flow blocker
22 substrate
23 connecting region

The invention claimed is:

1. A power converter, comprising:
   at least one semiconductor module, each having a base plate with a cooling structure, and
   a cooling housing,
   wherein the cooling housing comprises a receptacle plate and a cover, which is formed independent of the receptacle plate and which is welded to the receptacle plate around at least one opening provided in the receptacle plate,
   wherein each base plate is arranged in a corresponding one of the at least one opening of the receptacle plate and is thereby connected to the receptacle plate, so that each cooling structure extends into a cooling duct of the cooling housing,
   wherein a cooling fluid flows through the cooling duct, and the cooling duct is delimited by the receptacle plate, the cover, and each base plate,
   wherein a flow blocker configured as an insert is placed inside the cooling duct, inboard of all seams between the receptacle plate and the cover, and is shaped to guide the cooling fluid through each cooling structure and to reduce an amount of cooling fluid that would otherwise bypass each cooling structure, and
   wherein one or more of the base plate, the receptacle plate, and the cover are bent in a curved shape in a connecting region at which the base plate, the receptacle plate, and the cover are welded to one another.

2. The power converter as claimed in claim 1, wherein either the receptacle plate or the cover is formed as a trough-shaped embossing, and
   wherein a depth of the trough-shaped embossing accommodates the cooling structure.

3. The power converter as claimed in claim 1, wherein the cover has an inlet opening and an outlet opening which serve as fluidic connections.

4. The power converter as claimed in claim 3, wherein the inlet opening and outlet opening are formed substantially perpendicular to a dominant plane of the cover.

5. The power converter as claimed in claim 1, wherein the receptacle plate and the base plate are formed from aluminum or an aluminum alloy.

6. A method for producing the power converter as claimed in claim 1, comprising:
   a) welding each base plate onto the receptacle plate, and
   b) welding the cover onto the receptacle plate.

7. The method as claimed in claim 6, further comprising inserting the flow blocker before welding the cover onto the receptacle plate.

8. The power converter as claimed in claim 7, wherein a height of the flow blocker is selected to vertically align the cover for assembly.

9. The power converter as claimed in claim 1, wherein the receptacle plate is curved in an S-shape in cross-section such that:
   a first side of the S-shape is flush with the base plate at a first connecting region at which the receptacle plate is welded to the base plate, and
   a second side of the S-shape is co-planar with the cover at a second connecting region at which the receptacle plate is welded to the cover.

10. The power converter as claimed in claim 9, wherein the cover is bent towards the base plate at the second connecting region.

11. The power converter as claimed in claim 9, wherein a height of the flow blocker is selected to vertically align the cover for assembly.

12. The power converter as claimed in claim 1, wherein the receptacle plate is flush with the base plate at a first connecting region at which the receptacle plate is welded to the base plate, and
   wherein the cover has a cross section which is curved in an S-shape such that:
   a first side of the S-shape is flush with the receptacle plate, and
   a second side of the S-shape is spaced apart from the receptacle plate and the base plate.

13. The power converter as claimed in claim 12, wherein a terminating edge of the cover, at the first side of the S-shape, with the receptacle plate forms a second connecting region at which the cover is welded to the receptacle plate.

14. The power converter as claimed in claim 1, wherein a height of the flow blocker is selected to vertically align the cover for assembly.

* * * * *